US008320265B2

(12) United States Patent
Zhan et al.

(10) Patent No.: US 8,320,265 B2
(45) Date of Patent: Nov. 27, 2012

(54) METHOD AND APPARATUS FOR OBTAINING AN ATTENUATION FACTOR

(75) Inventors: Wuzhou Zhan, Shenzhen (CN); Dongqi Wang, Shenzhen (CN); Yongfeng Tu, Shenzhen (CN); Jing Wang, Shenzhen (CN); Qing Zhang, Shenzhen (CN); Lei Miao, Shenzhen (CN); Jianfeng Xu, Shenzhen (CN); Chen Hu, Shenzhen (CN); Yi Yang, Shenzhen (CN); Zhengzhong Du, Shenzhen (CN); Fengyan Qi, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 53 days.

(21) Appl. No.: 12/264,593

(22) Filed: Nov. 4, 2008

(65) Prior Publication Data

US 2009/0116486 A1 May 7, 2009

(30) Foreign Application Priority Data

Nov. 5, 2007 (CN) .......................... 2007 1 0169618

(51) Int. Cl.

| | |
|---|---|
| ***G01R 31/08*** | (2006.01) |
| ***G06F 11/00*** | (2006.01) |
| ***G08C 15/00*** | (2006.01) |
| ***H04J 1/16*** | (2006.01) |
| ***H04J 3/14*** | (2006.01) |
| ***H04L 1/00*** | (2006.01) |
| ***H04L 12/26*** | (2006.01) |

(52) U.S. Cl. ....................................................... 370/252

(58) Field of Classification Search .................. 370/232, 370/252

See application file for complete search history.

(56) References Cited

U.S. PATENT DOCUMENTS

| | | | | |
|---|---|---|---|---|
| 5,699,485 | A * | 12/1997 | Shoham | 704/223 |
| 5,787,430 | A | 7/1998 | Doeringer et al. | |
| 5,953,697 | A | 9/1999 | Lin et al. | |
| 6,011,795 | A | 1/2000 | Varghese et al. | |
| 6,665,637 | B2 | 12/2003 | Bruhn | |

(Continued)

FOREIGN PATENT DOCUMENTS

CN 1983909 A 6/2007

(Continued)

OTHER PUBLICATIONS

Thyssen et al., "A Candidate for the ITU-T G.722 Packet Loss Concealment Standard," *International Conference on Acoustics, Speech and Signal Processing*, iv-549-iv-552 (Apr. 2007).

(Continued)

*Primary Examiner* — Huy D Vu
*Assistant Examiner* — Adnan Baig
(74) *Attorney, Agent, or Firm* — Leydig, Voit & Mayer, Ltd.

(57) ABSTRACT

The present invention discloses a method for obtaining an attenuation factor. The method is adapted to process the synthesized signal in packet loss concealment, and includes: obtaining a change trend of a signal; obtaining an attenuation factor, according to the change trend of the signal. The present invention also discloses an apparatus for obtaining an attenuation factor. A self-adaptive attenuation factor is adjusted dynamically by using the latest change trend of a history signal by using the present invention. The smooth transition from the history data to the data last received is realized so that the attenuation speed is kept consistent between the compensated signal and the original signal as much as possible for adapting to the characteristic of various human voices.

15 Claims, 7 Drawing Sheets

U.S. PATENT DOCUMENTS

| | | | | |
|---|---|---|---|---|
| 6,785,687 | B2 | 8/2004 | Baskins et al. | |
| 6,816,856 | B2 | 11/2004 | Baskins et al. | |
| 6,987,821 | B1 | 1/2006 | Li | |
| 7,415,463 | B2 | 8/2008 | Testa | |
| 7,415,472 | B2 | 8/2008 | Testa | |
| 7,502,735 | B2 | 3/2009 | Ehara | |
| 2003/0055632 | A1 | 3/2003 | Chen | |
| 2003/0074197 | A1 | 4/2003 | Chen | |
| 2003/0177011 | A1 | 9/2003 | Yasuda et al. | |
| 2004/0064308 | A1 | 4/2004 | Deisher | |
| 2005/0010401 | A1 | 1/2005 | Sung et al. | |
| 2005/0049853 | A1 | 3/2005 | Lee et al. | |
| 2005/0143985 | A1 | 6/2005 | Sung et al. | |
| 2005/0154584 | A1* | 7/2005 | Jelinek et al. | 704/219 |
| 2005/0166124 | A1* | 7/2005 | Tsuchinaga et al. | 714/776 |
| 2005/0231353 | A1* | 10/2005 | DiPoala et al. | 340/522 |
| 2006/0026318 | A1 | 2/2006 | Lee | |
| 2007/0083362 | A1 | 4/2007 | Moriya et al. | |
| 2007/0174047 | A1 | 7/2007 | Anderson et al. | |
| 2008/0071530 | A1 | 3/2008 | Ehara | |
| 2008/0133517 | A1 | 6/2008 | Kapoor et al. | |
| 2008/0133518 | A1 | 6/2008 | Kapoor et al. | |
| 2008/0154584 | A1 | 6/2008 | Andersen | |
| 2008/0275580 | A1 | 11/2008 | Andersen | |
| 2009/0061785 | A1 | 3/2009 | Kawashima et al. | |
| 2009/0089050 | A1 | 4/2009 | Mo et al. | |

FOREIGN PATENT DOCUMENTS

| | | | |
|---|---|---|---|
| CN | 1989548 | A | 6/2007 |
| EP | 1 291 851 | A2 | 3/2003 |
| JP | 63221399 | A | 9/1988 |
| JP | 06130999 | A | 5/1994 |
| JP | 09101800 | A | 4/1997 |
| JP | 2000-059231 | A | 2/2000 |
| JP | 2001-228896 | A | 8/2001 |
| JP | 2004512561 | A | 4/2004 |
| JP | 2005024756 | A | 1/2005 |
| JP | 2005094356 | A | 4/2005 |
| KR | 1020030024721 | A | 3/2003 |
| KR | 2005-0005517 | | 1/2005 |
| KR | 1020050005517 | A | 1/2005 |
| KR | 10-0745683 | | 5/2007 |
| KR | 2007-0055943 | A | 5/2007 |
| KR | 10-745683 | | 8/2007 |
| WO | 02071389 | A1 | 9/2002 |
| WO | 03102921 | A1 | 12/2003 |
| WO | 2004068098 | A1 | 8/2004 |
| WO | 2005066937 | A1 | 7/2005 |
| WO | 2005086138 | A1 | 9/2005 |
| WO | WO 2006/009074 | A1 | 1/2006 |
| WO | 2006079350 | A1 | 8/2006 |
| WO | WO 2006/098274 | A1 | 9/2006 |
| WO | 2007143953 | A1 | 12/2007 |

OTHER PUBLICATIONS

Korean Intellectual Property Office, Examination Report in Korean Patent Application No. 10-2008-0108894 (Aug. 26, 2010).

Pre-trial Inquiry in corresponding Japanese Application No. 2010-5820 (Nov. 2, 2010).

State Intellectual Property Office of the People'S Republic of China, First Chinese Office Action in Chinese Application No. 2008-800010241 (May 12, 2011).

Korean Intellectual Property Office, Notice to Submit a Response in Korean Application No. 10-2008-0108895 (Apr. 6, 2011).

Thyssen et al., "A Candidate for the ITU-T G.722 Packet Loss Concealment Standard," Broadcom Corporation, Irvine, California, USA, IEEE (2007) pp. IV549-IV552.

2nd Office Action in corresponding Chinese Patent Application No. 200880001024.1 (Feb. 17, 2012).

Office Action in corresponding European Patent Application No. 08168328.6 (Aug. 4, 2009).

Office Action in corresponding Chinese Patent Application No. 2007101696180 (Oct. 10, 2008).

Office Action in corresponding Chinese Patent Application No. 2007101696180 (Mar. 27, 2009).

Office Action in corresponding Chinese Patent Application No. 2007101696180 (Jul. 31, 2009).

Office Action in corresponding Chinese Patent Application No. 2007101696180 (Apr. 1, 2010).

Decision of Rejection in corresponding Japanese Patent Application No. 2008284260 (Nov. 17, 2009).

"General Aspects of Digital Transmission Systems—Coding of Speech at 8 kbit/s Using Conjugate-Structure Algebraic-Code-Excited Linear-Prediction (CS-ACELP)—G.729 Standard," 1996 International Telecommunications Union, Geneva, Switzerland.

"General Aspects of Digital Transmission Systems—Dual Rate Speech Coder for Multimedia Communications Transmitting at 5.3 and 6.3 kbit/s—G.723.1 Standard," 1996, International Telecommunication Union, Geneva, Switzerland.

"Series G: Transmission Systems and Media, Digital Systems and Networks; Digital Terminal Equipments—Coding of Analogue Signals by Methods other than PCM; A Low-Complexity Algorithm for Packet Loss Concealment with G.722," G.722 Appendix IV (Nov. 2006).

"Series G: Transmission Systems and Media, Digital Systems and Networks; Digital Terminal Equipments—Coding of Analogue Signals by Pulse Code Modulation; Wideband Embedded Extension for G.711 Pulse Code Modulation," G.711 (Mar. 2008).

Gunduzhan et al., "A Linear Prediction Based Packet Loss Concealment Algorithm for PCM Coded Speech," IEEE Transactions on Speech and Audio Processing, 9(8): 778-785 (Nov. 2001).

"Appendix IV: A Low-Complexity Algorithm for Packet Loss Concealment with G.722," ITU-T Telecommunication Standardization Sector of ITU, 1-24 (Nov. 2006).

Notice of Reasons for Rejection in corresponding Japanese Patent Application 2010-060127 (Jul. 17, 2012).

* cited by examiner

METHOD AND APPARATUS FOR OBTAINING AN ATTENUATION FACTOR

CROSS-REFERENCE TO RELATED APPLICATIONS

This application claims priority to Chinese Patent Application No. 200710169618.0, filed Nov. 5, 2007, entitled "Method And Apparatus For Obtaining An Attenuation Factor," the contents of which are hereby incorporated by reference in their entirety.

FIELD OF THE INVENTION

The present invention relates to the field of signal processing, and particularly, to a method and an apparatus for obtaining an attenuation factor.

BACKGROUND OF THE INVENTION

A transmission of voice data is required to be real-time and reliable in a real time voice communication system, for example, a VoIP (Voice over IP) system. Because of unreliable characteristics of a network system, data packets may be lost or not reach the destination in time in a transmission procedure from a sending end to a receiving end. These two kinds of situations are both considered as network packet loss by the receiving end. It is unavoidable for the network packet loss to happen. Meanwhile, the network packet loss is one of the most important factors influencing the talk quality of the voice. Therefore, a robust packet loss concealment method is needed to recover the lost data packet in the real time communication system so that a good talk quality is still obtained under the situation of the network packet loss.

In the existing real-time voice communication technology, in the sending end, an encoder divides a broad band voice into a high sub band and a low sub band, and uses ADPCM (Adaptive Differential Pulse Code Modulation) to encode the two sub bands, respectively, and sends them together to the receiving end via the network. In the receiving end, the two sub bands are decoded, respectively, by the ADPCM decoder, and then the final signal is synthesized by using a QMF (Quadrature Mirror Filter) synthesis filter.

Different Packet Loss Concealment (PLC) methods are adopted for two different sub bands. For a low band signal, under the situation with no packet loss, a reconstruction signal is not changed during CROSS-FADING. Under the situation with packet loss, for the first lost frame, the history signal (the history signal is a voice signal before the lost frame in the present application document) is analyzed by using a short term predictor and a long term predictor, and voice classification information is extracted. The lost frame signal is reconstructed by using a LPC (linear predictive coding) based on pitch repetition method, the predictor and the classification information. The status of ADPCM will be also updated synchronously until a good frame is found. In addition, not only the signal corresponding to the lost frame needs to be generated, but also a section of signal adapting for CROSS-FADING needs to be generated. In that way, once a good frame is received, the CROSS-FADING is executed to process the good frame signal and the section of signal. It is noticed that this kind of CROSS-FADING only happens after the receiving end loses a frame and receives the first good frame.

During the process of realizing the present invention, the inventor finds out at least following problems in the prior art: the energy of the synthesized signal is controlled by using a static self-adaptive attenuation factor in the prior art. Although the attenuation factor defined changes gradually, its attenuation speed, i.e. the value of the attenuation factor, is the same regarding the same classification of voice. However, human voices are various. If the attenuation factor does not match the characteristic of human voices, there will be uncomfortable noise in the reconstruction signal, particularly at the end of the steady vowels. The static self-adaptive attenuation factor cannot be adapted for the characteristic of various human voices.

The situation shown in FIG. 1 is taken as an example, wherein T0 is the pitch period of the history signal. The upper signal corresponds to an original signal, i.e. a waveform schematic diagram under the situation with no packet loss. The underneath signal with dash line is a signal synthesized, according to the prior art. As can be seen from the figure, the synthesized signal does not keep the same attenuation speed with the original signal. If there are too many times of the same pitch repetition, the synthesized signal will produce obvious music noise so that the difference between the situation of the synthesized signal, and the desirable situation is great.

SUMMARY

An embodiment of the present invention provides a method and an apparatus for obtaining an attenuation factor adapted to obtain a self-adaptive and dynamically adjustable the attenuation factor used in the processing of synthetic signal.

An embodiment of the present invention provides a method for obtaining the attenuation factor adapted to process the synthesized signal in packet loss concealment, including:

obtaining a change trend of a signal; and obtaining an attenuation factor, according to the change trend of the signal.

An embodiment of the present invention also provides an apparatus for obtaining the attenuation factor, adapted to process the synthesized signal in packet loss concealment, including:

a change trend obtaining unit adapted to obtain a change trend of a signal; and an attenuation factor obtaining unit adapted to obtain an attenuation factor, according to the change trend obtained by the change trend obtaining unit.

An embodiment of the present invention also provides a method and an apparatus for obtaining an attenuation factor adapted to realize the smooth transition from the history data to the latest received data.

In order to realize the above object, an embodiment of the present invention provides a method for signal processing, adapted to process a synthesized signal in packet loss concealment, including:

obtaining a change trend of a signal;

obtaining an attenuation factor according to the change trend of the signal; and obtaining a lost frame reconstructed after attenuating, according to the attenuation factor.

An embodiment of the present invention also provides an apparatus for signal processing, adapted to process a synthesized signal in packet loss concealment, including the following units:

a change trend obtaining unit adapted to obtain a change trend of a signal;

an attenuation factor obtaining unit adapted to obtain an attenuation factor, according to the change trend obtained by the change trend obtaining unit; and a lost frame reconstructing unit adapted to obtain a lost frame reconstructed after attenuating according to the attenuation factor.

An embodiment of the present invention also provides a voice decoder adapted to decode the voice signal, including a low band decoding unit, a high band decoding unit, and a quadrature mirror filtering unit.

The low band decoding unit is adapted to decode a received low band decoding signal and compensate a lost low band signal.

The high band decoding unit is adapted to decode a received high band decoding signal, and compensate a lost high band signal.

The quadrature mirror filtering unit is adapted to obtain a final output signal by synthesizing the low band decoding signal and the high band decoding signal.

The low band decoding unit includes a low band decoding subunit, a LPC based on pitch repetition subunit, and a cross-fading subunit.

The low band decoding subunit is adapted to decode a received low band stream signal.

The LPC based on pitch repetition subunit is adapted to generate a synthesized signal corresponding to the lost frame.

The cross-fading subunit is adapted to cross fade the signal processed by the low band decoding subunit and synthesized signal corresponding to the lost frame generated by the LPC based on pitch repetition subunit.

The LPC based on pitch repetition subunit includes an analyzing module and a signal processing module.

The analyzing module is adapted to analyze a history signal, and generate a reconstructed lost frame signal.

The signal processing module is adapted to obtain a change trend of a signal, obtain an attenuation factor according to the change trend of the signal, attenuate the reconstructed lost frame signal, and obtain a lost frame reconstructed after attenuating.

An embodiment of the present invention further provides a product of computer program. The product of computer program comprises computer program codes which enable a computer to execute the steps in any one of the methods for obtaining an attenuation factor in packet loss concealment when the computer program codes are executed by the computer.

An embodiment of the present invention further provides a computer-accessible storage medium. The computer-accessible storage medium stores computer program codes, which enable a computer to execute the steps in any one of the methods for obtaining an attenuation factor in packet loss concealment when the computer program codes are executed by the computer.

An embodiment of the present invention further provides a product of computer program. The product of computer program comprises computer program codes, which enable a computer to execute the steps in any one of the methods for signal processing in packet loss concealment when the computer program codes are executed by the computer.

An embodiment of the present invention further provides a computer-accessible storage medium. The computer-accessible storage medium stores computer program codes, which enable a computer to execute the steps in any one of the method for signal processing in packet loss concealment when the computer program codes are executed by the computer.

Compared with the prior art, embodiments of the present invention have the following advantages:

A self-adaptive attenuation factor is adjusted dynamically by using the change trend of a history signal. The smooth transition from the history data to the latest received data is realized so that the attenuation speed between the compensated signal and the original signal is kept consistent as much as possible for adapting the characteristic of various human voices.

DETAILED DESCRIPTION

The present invention will be described in more detail with reference to the drawings and embodiments.

Figure 1:
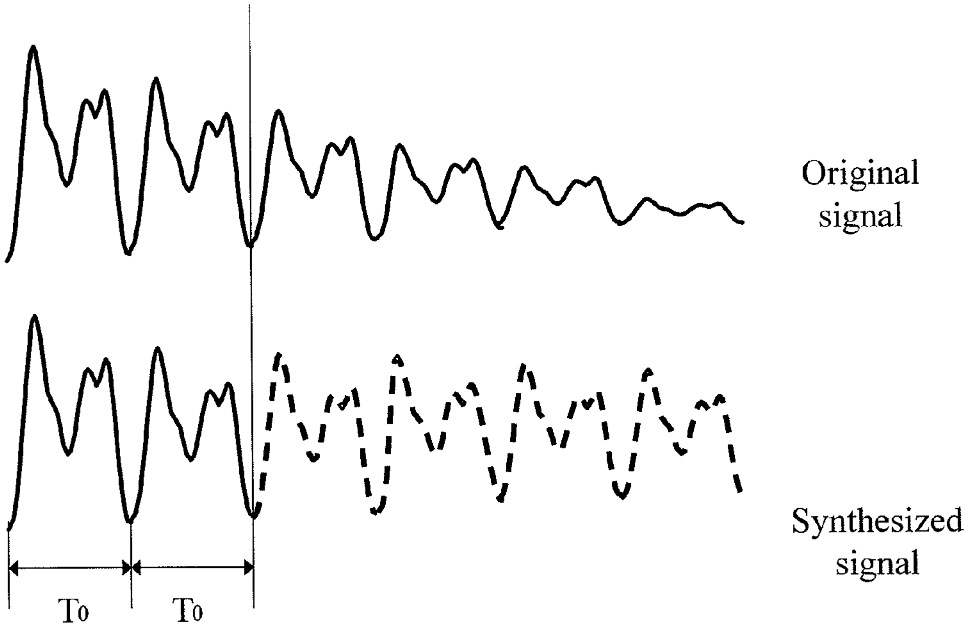
FIG. 1 is a schematic diagram illustrating the original signal and the synthesized signal.
Figure 2:
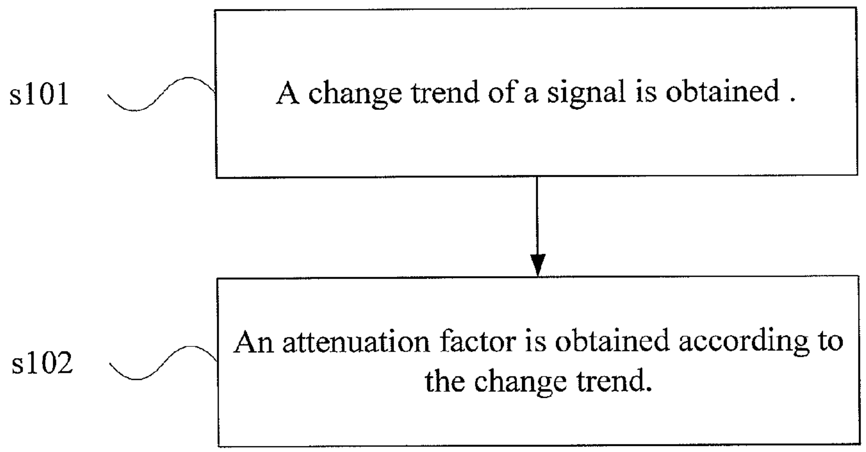
FIG. 2 is a flow chart illustrating a method for obtaining an attenuation factor, according to Embodiment 1 of the present invention.

A method for obtaining an attenuation factor is provided in Embodiment 1 of the present invention, adapted to process the synthesized signal in packet loss concealment, as shown in the FIG. 2, includes the following steps.

Step s101, a change trend of a signal, is obtained.

Specifically, the change trend may be expressed in the following parameters: (1) a ratio of the energy of the last pitch periodic signal to the energy of the previous pitch periodic signal in the signal; and (2) a ratio of the difference between the maximum amplitude value and the minimum amplitude value of the last pitch periodic signal to the difference between the maximum amplitude value and the minimum amplitude value of the previous pitch periodic signal in the signal.

Step s102, an attenuation factor, is obtained according to the change trend.

The specific processing method of Embodiment 1 of the present invention will be described together with specific application scene.

A method for obtaining an attenuation factor which is adapted to process the synthesized signal in packet loss concealment is provided in Embodiment 1 of the present invention.

Figure 3:
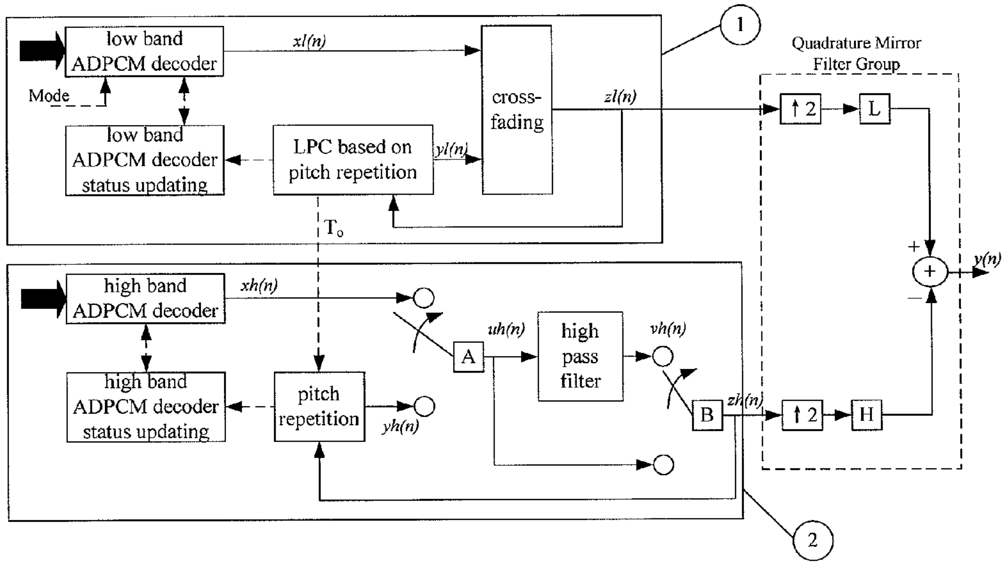
FIG. 3 is a schematic diagram illustrating principles of the encoder.

As shown in the FIG. 3, different PLC methods are adopted for two different sub bands. The PLC method for the low band part is shown as the part ① in a dashed frame in FIG. 3. While a dashed frame ② in FIG. 3 is corresponding to the PLC algorithm for the high band. For a high band signal, zh(n) is a finally outputted high band signal. After obtaining the low band signal zl(n) and the high band signal zh(n), the QMF is executed for the low band signal and the high band signal and a finally outputted broad band signal y(n) is synthesized.

Only the low band signal is described in detail as follows.

Under the situation with no frame loss, the signal xl(n), n=0, . . . , L−1 is obtained after decoding the current frame received by the low band ADPCM decoder, and the output is zl(n),n=0, . . . L−1, corresponding to the current frame. In this situation, the reconstruction signal is not changed during CROSS-FADING, that is zl[n]=xl[n], n=0, . . . , L−1, wherein L is the length of the frame.

Under the situation with loss of frames, regarding the first lost frame, the history signal zl(n), n<0 is analyzed by using a short term predictor and a long term predictor, and voice classification information is extracted. By adopting the above predictors and the classification information, the signal yl(n) is generated by using a method of LPC, based on pitch repetition. And the lost frame signal zl(n) is reconstructed as zl(n)=yl(n), n=0, . . . , L−1. In addition, the status of ADPCM will also be updated synchronously until a good frame is found. It is noticed that not only the signal corresponding to the lost frame needs to be generated, but also a 10 ms signal yl(n),n=L, . . . , L+M−1 adapting for CROSS-FADING needs to be generated, the M is the number of signal sampling points which are included in the process when calculating the energy. In that way, once a good frame is received, the CROSS-FADING is executed for the xl(n), n=L, . . . , L+M−1, and the yl(n), n=L, . . . , L+M−1. It is noticed that this kind of CROSS-FADING only happens after a frame loss and when the receiving end receives the first good frame data.

Figure 4:
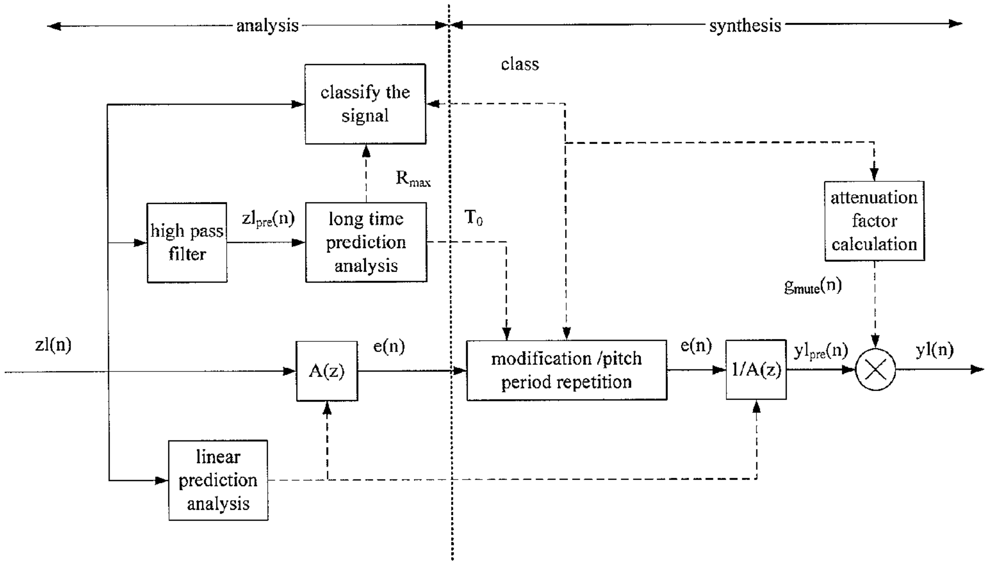
FIG. 4 is a schematic diagram illustrating the module of a LPC, based on the pitch repetition subunit of the low band decoding unit.

A LPC based on pitch repetition method in the FIG. 3 is as shown in the FIG. 4.

When the data frame is a good frame, the zl(n) is stored into a buffer for use in future.

When the first lost frame is found, the final signal yl(n) needs to be synthesized in two steps. At first, the history signal zl(n), n=−297, . . . , −1 is analyzed. Then the signal yl(n), n=0, . . . , L−1 is synthesized according to the result of the analysis, wherein L is the frame length of the data frame, i.e. the number of sampling points corresponding to one frame of signal, Q is the length of the signal which is needed for analyzing the history signal.

The LPC module based on the pitch repetition specifically includes following parts.

(1) A LP (Linear Prediction) Analysis

The short-term analysis filter A(z) and synthesis filter 1/A(z) are Linear Prediction (LP) filters based on P order. The LP analysis filter is defined as:

$$A(z)=1+a_1z^{-1}+a_2z^{-2}+\dots+a_Pz^{-P}$$

Through the LP analysis of the history signal zl(n), n=−Q, . . . , −1 with the filter A(z), a residual signal e(n), n=−Q, . . . , −1 corresponding to the history signal zl(n), n=−Q, . . . , −1 is obtained:

$$e(n)=zl(n)+\sum_{i=1}^{P}a_i zl(n-i),\ n=-Q,\ \dots,\ -1$$

(2) A History Signal Analysis

The lost signal is compensated by a pitch repetition method. Therefore, at first a pitch period $T_0$ corresponding to the history signal zl(n), n=−Q, . . . , −1 needs to be estimated. The steps are as follows: The zl(n) is preprocessed to remove a needless low frequency ingredient in a LTP (long term prediction) analysis, and the pitch period $T_0$ of the zl(n) may be obtained by the LTP analysis. The classification of voice is obtained though combining a signal classification module after obtaining the pitch period $T_0$.

Voice classifications are as shown in the following Table 1:

TABLE 1

VOICE CLASSIFICATIONS

| Classification Name | Explanation |
|---|---|
| TRANSIENT | for voices with large energy variation (e.g. plosives) |
| UNVOICED | for unvoiced signals |
| VUV_TRANSITION | for a transition between voiced and unvoiced signals |
| WEAKLY_VOICED | for weekly voiced signals (e.g. onset or offset vowels) |
| VOICED | voiced signals (e.g. steady vowels) |

(3) A Pitch Repetition

A pitch repetition module is adapted to estimate a LP residual signal e(n), n=0, . . . , L−1 of a lost frame. Before the pitch repetition is executed, if the classification of the voice is not VOICED, the following formula is adopted to limit the amplitude of a sample:

$$e(n)=\min\left(\max_{i=-2,\dots,+2}(|e(n-T_0+i)|),\ |e(n)|\right)\times\mathrm{sign}(e(n)),$$
$$n=-T_0,\ \dots,\ -1$$

wherein, $$\mathrm{sign}(x)=\begin{cases}1 & \text{if } x\geq 0\\ -1 & \text{if } x<0\end{cases}$$

If the classification of the voice is VOICED, the residual e(n),n=0, . . . , L−1 corresponding to the lost signal is obtained by adopting a step of repeating the residual signal corresponding to the signal of the last pitch period in the signal of a good frame newly received, that is:

$$e(n)=e(n-T_0)$$

Regarding other classifications of voices, for avoiding that the periodicity of the generated signal is too intense (regarding the non-voice signal, if the periodicity is too intense, some uncomfortable noise like music noise may be heard), the residual signal e(n), n=0, . . . , L−1 corresponding to the lost signal is generated by using the following formula:

$$e(n)=e(n-T_0+(-1)^n)$$

Besides generating the residual signal corresponding to the lost frame, the residual signals e(n), n=L, . . . , L+N−1 of extra N samples continue to be generated so as to generate a signal adapted for CROSS-FADING, in order to ensure the smooth splicing between the lost frame and the first good frame after the lost frame.

(4) A LP Synthesis

After generating the residual signal e(n) corresponding to the lost frame and the CROSS-FADING, a reconstruction lost frame signal $yl_{pre}(n)$, n=0, . . . , L−1 is obtained by using the following formula:

$$yl_{pre}(n) = e(n) - \sum_{i=1}^{8} a_i yl(n-i)$$

wherein, the residual signal e(n), n=0, . . . , L−1 is the residual signal obtained from the above pitch repetition steps.

Besides, $yl_{pre}(n)$, n=L, . . . , L+N−1 with N samples adapted for CROSS-FADING are generated by using the above formula.

(5) An Adaptive Muting

For realizing a smooth energy transition, before executing the QMF with the high band signal, the low band signal also needs to do the CROSS-FADING, the rules are shown as the following table:

| | current frame | |
|---|---|---|
| previous frame | bad frame | good frame |
| bad frame | zl(n) = yl(n), n = 0, . . . , L − 1 | $zl(n) = \frac{n}{N-1}xl(n) + \left(1 - \frac{n}{N-1}\right)yl(n)$, n = 0, ..., N − 1 and zl(n) = xl(n), n = N, ..., L − 1 |
| good frame | zl(n) = yl(n), n = 0, . . . , L − 1 | zl(n) = xl(n), n = 0, . . . , L − 1 |

In the above table, zl(n) is a finally outputted signal corresponding to the current frame; xl(n) is the signal of the good frame corresponding to the current frame; yl(n) is a synthesized signal corresponding to the same time of the current frame, wherein L is the frame length, the N is the number of samples executing CROSS-FADING.

Aiming at different voice classifications, the energy of signal in $yl_{pre}(n)$ is controlled before executing CROSS-FADING according to the coefficient corresponding to every sample. The value of the coefficient changes, according to different voice classifications and the situation of packet loss.

Figure 5:
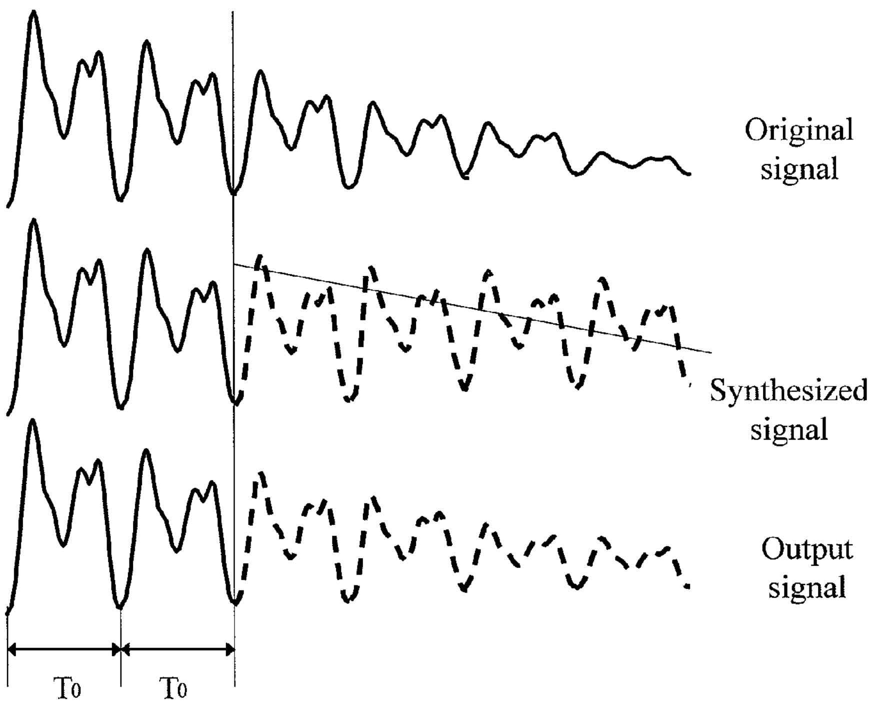
FIG. 5 is a schematic diagram illustrating an output signal after adopting the method of dynamical attenuation according to Embodiment 1 of the present invention.

In detail, in the case that the last two pitch periodic signal in the received history signal is the original signal as shown in FIG. 5, the self-adaptive dynamic attenuation factor is adjusted dynamically according to the change trend of the last two pitch period in the history signal. Detailed adjustment method includes the following steps:

Step s201, the change trend of the signal, is obtained.

The signal change trend may be expressed by the ratio of the energy of the last pitch periodic signal to the energy of the previous pitch periodic signal in the signal, i.e. the energy E1 and E2 of the last two pitch period signal in the history signal, and the ratio of the two energies is calculated.

$$E_1 = \sum_{i=1}^{T_0} xl^2(-i)$$

$$E_2 = \sum_{i=1}^{T_0} xl^2(-i - T_0)$$

$$R = \sqrt{\frac{E_1}{E_2}}$$

$E_1$ is the energy of the last pitch period signal, $E_2$ is the energy of the previous pitch period signal, and $T_0$ is the pitch period corresponding to the history signal.

Optionally, the change trend of signal may be expressed by the ratio of the peak-valley differences of the last two pitch periods in the history signal.

$$P_1 = \max(xl(i)) - \min(xl(j))\ (i,j) = -T_0, \ldots, -1$$

$$P_2 = \max(xl(i)) - \min(xl(j))\ (i,j) = -2T_0, \ldots, -(T_0+1)$$

wherein, $P_1$ is the difference between the maximum amplitude value and the minimum amplitude value of the last pitch periodic signal, $P_2$ is the difference between the maximum amplitude value and the minimum amplitude value of the previous pitch periodic signal, and the ratio is calculated as:

$$R = \frac{P_1}{P_2}$$

Step s202, the synthesized signal is attenuated dynamically, according to the obtained change trend of the signal. The calculation formula is shown as follows:

$$yl(n) = yl_{pre}(n) * (1 - C*(n+1))\ n = 0, \ldots, N-1$$

wherein, $yl_{pre}(n)$ is the reconstruction lost frame signal, N is the length of the synthesized signal, and C is the self-adaptive attenuation coefficient whose value is:

$$C = \frac{1-R}{T_0}$$

Under the situation of the attenuation factor $1-C*(n+1)<0$, it is needed to set $1-C*(n+1)=0$, so as to avoid appearing of a situation that the attenuation factor corresponding to the samples is minus.

In particular, for avoiding the situation that the amplitude value corresponding to a sample may overflow under the situation of R>1, the synthesized signal is attenuated dynamically by using the formula of the Step s202 in the present embodiment that may take only the situation of R<1 into account.

In particular, in order to avoid the situation that the attenuation speed of the signal with less energy is too fast, only under the situation that $E_1$ exceeds a certain limitation value, the synthesized signal is attenuated dynamically by using the formula of the Step s202 in the present embodiment.

In particular, for avoiding that the attenuation speed of the synthesized signal is too fast, especially under the situation of continuous frame loss, an upper limitation value is set for the attenuation coefficient C. When C*(n+1) exceeds a limitation value, the attenuation coefficient is set as the upper limitation value.

In particular, under the situation of bad network environment and continuous frame loss, a certain condition may be set to avoid too fast attenuation speed. For example, it may be taken into account that, when the number of the lost frames exceeds an appointed number, for example two frames; or when the signal corresponding to the lost frame exceeds an appointed length, for example 20 ms; or in at least one of the above conditions of the current attenuation coefficient $1-C^*(n+1)$ reaches an appointed threshold value, the attenuation coefficient C needs to be adjusted so as to avoid the too fast attenuation speed which may result in the situation that the output signal becomes silence voice.

For example under the situation sampling in 8 k Hz frequency and the frame length of 40 samples, the number of lost frame may be set as 4, and after the attenuation factor $1-C^*(n+1)$ becomes less than 0.9, the attenuation coefficient C is adjusted to be a smaller value. The rule of adjusting the smaller value is as follows.

Hypothetically, it's predicted that the current attenuation coefficient is C and the value of attenuation factor is V, and the attenuation factor V may attenuate to 0 after V/C samples. While more desirable situation is that the attenuation factor V should attenuate to 0 after $M(M \neq V/C)$ samples. So the attenuation coefficient C is adjusted to:

$$C=V/M$$

As shown in FIG. 5, the top signal is the original signal; the middle signal is the synthesized signal. As seen from the figure, although the signal has attenuation of certain degree, the signal still remains intensive sonant characteristic. If the duration is too long, the signal may be shown as music noise, especially at the end of the sonant. The bottom signal is the signal after using the dynamical attenuation in the embodiment of the present invention, which may be seen quite similar to the original signal.

According to the method provided by the above-mentioned embodiment, the self-adaptive attenuation factor is adjusted dynamically by using the change trend of the history signal, so that the smooth transition from the history data to the latest received data may be realized. The attenuation speed is kept consistent as far as possible between the compensated signal and the original signal as much as possible for adapting the characteristic of various human voices.

An apparatus for obtaining an attenuation factor is provided in Embodiment 2 of the present invention, adapted to process the synthesized signal in packet loss concealment, including:

a change trend obtaining unit 10, adapted to obtain a change trend of a signal; and an attenuation factor obtaining unit 20, adapted to obtain an attenuation factor, according to the change trend obtained by the change trend obtaining unit 10.

The attenuation factor obtaining unit 20 further includes: an attenuation coefficient obtaining subunit 21, adapted to generate the attenuation coefficient according to the change trend obtained by the change trend obtaining unit 10; and an attenuation factor obtaining subunit 22, adapted to obtain an attenuation factor, according to attenuation coefficient generated by the attenuation factor obtaining subunit 21. The attenuation factor obtaining unit 20 further includes: an attenuation coefficient adjusting subunit 23, adapted to adjust the value of the attenuation coefficient obtained by the attenuation coefficient obtaining subunit 21 to a given value on given conditions which include at least one of the following: whether the value of the attenuation coefficient exceeds an upper limitation value; whether there exits the situation of continuous frame loss; and whether the attenuation speed is too fast.

The method for obtaining an attenuation factor in the above embodiment is the same as the method for obtaining an attenuation factor in the embodiments of method.

In detail, the change trend obtained by the change trend obtaining unit 10 may be expressed in the following parameters: (1) a ratio of the energy of the last pitch periodic signal to the energy of the previous pitch periodic signal in the signal; and (2) a ratio of a difference between the maximum amplitude value and the minimum amplitude value of the last pitch periodic signal to a difference between the maximum amplitude value and the minimum amplitude value of the previous pitch periodic signal in the signal.

Figure 6A:
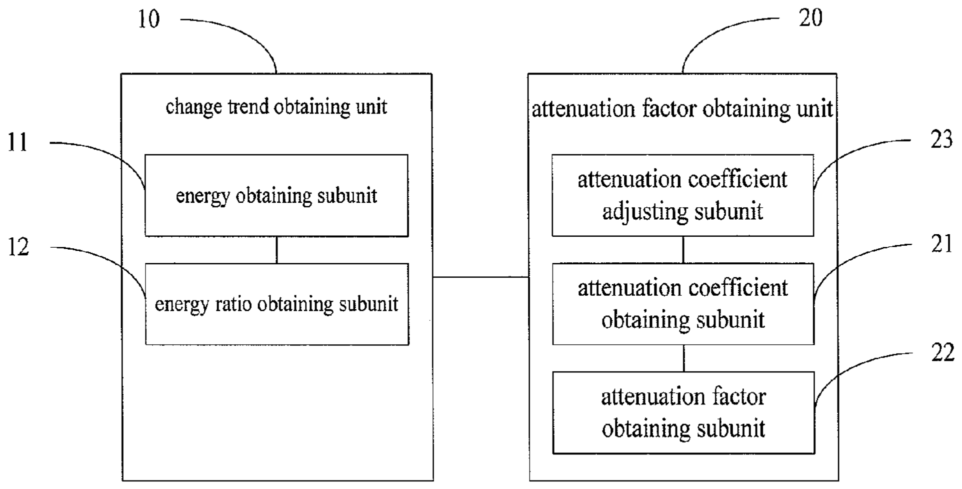
FIGS. 6A and 6B are schematic diagrams illustrating the structure of the apparatus for obtaining an attenuation factor, according to Embodiment 2 of the present invention.

When the change trend is expressed in the energy ratio in the (1), the structure of the apparatus for obtaining an attenuation factor is as shown in FIG. 6A. The change trend obtaining unit 10 further includes:

an energy obtaining subunit 11 adapted to obtain the energy of the last pitch periodic signal and the energy of the previous pitch periodic signal; and an energy ratio obtaining subunit 12 adapted to obtain the ratio of the energy of the last pitch periodic signal to the energy of the previous pitch periodic signal obtained by the energy obtaining subunit 11 and use the ratio to show the change trend of the signal.

Figure 6B:
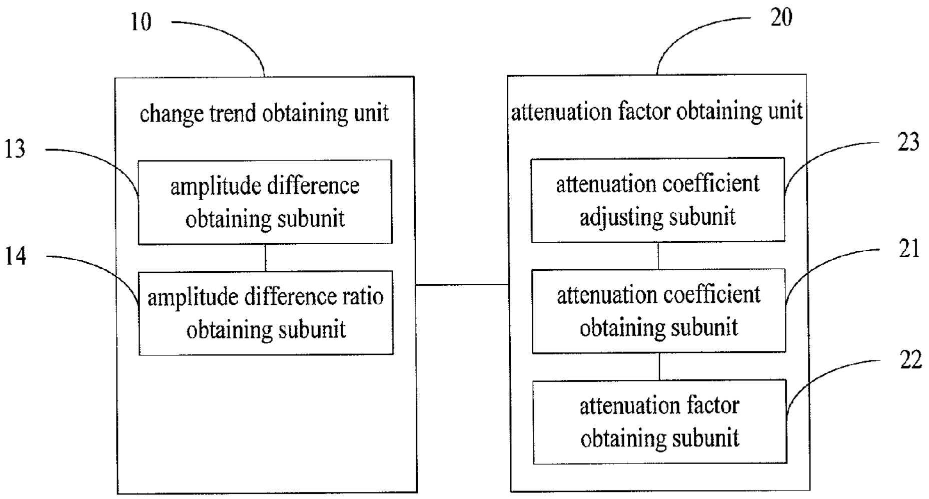

When the change trend is expressed in the amplitude difference ratio in the (2), the structure of the apparatus for obtaining an attenuation factor is as shown in FIG. 6B. The change trend obtaining unit 10 further includes:

an amplitude difference obtaining subunit 13, adapted to obtain the difference between the maximum amplitude value and the minimum amplitude value of the last pitch periodic signal, and the difference between the maximum amplitude value and the minimum amplitude value of the previous pitch periodic signal; and an amplitude difference ratio obtaining subunit 14, adapted to obtain the ratio of the difference between the maximum amplitude value and the minimum amplitude value of the last pitch periodic signal to the difference between the maximum amplitude value and the minimum amplitude value of the previous pitch periodic signal, and use the ratio to show the change trend of the signal.

Figure 7:
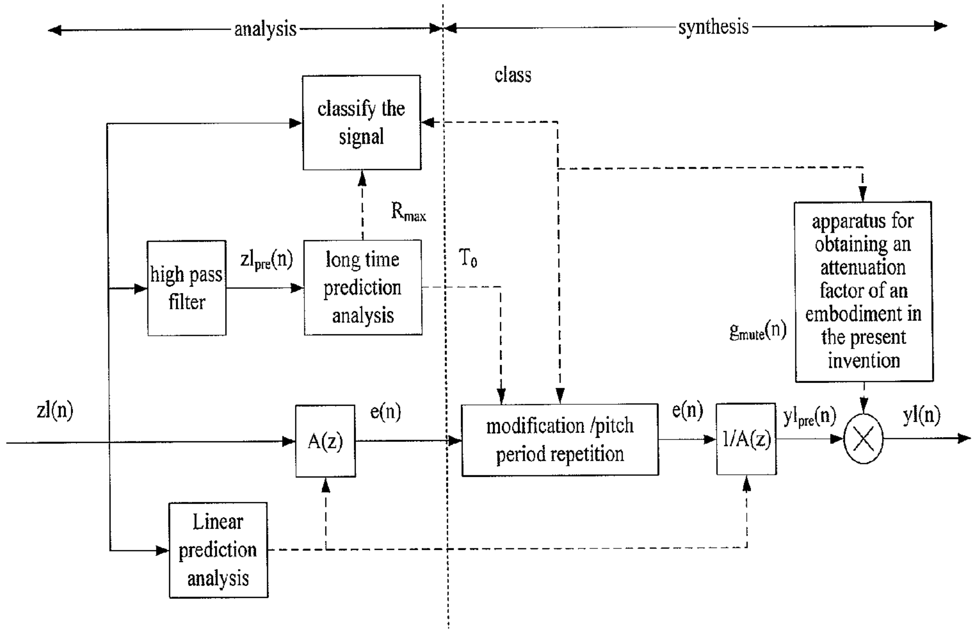
FIG. 7 is a schematic diagram illustrating the application scene of the apparatus for obtaining an attenuation factor, according to Embodiment 2 of the present invention.

A schematic diagram illustrating the application scene of the apparatus for obtaining an attenuation factor, according to Embodiment 2 of the present invention is as shown in FIG. 7. The self-adaptive attenuation factor is adjusted dynamically by using the change trend of the history signal.

By using the apparatus provided by the above-mentioned embodiment, the self-adaptive attenuation factor is adjusted dynamically by using the change trend of the history signal so that the smooth transition from the history data to the latest received data is realized. The attenuation speed is kept consistent as far as possible between the compensated signal and the original signal as much as possible for adapting the characteristic of various human voices.

Figure 8A:
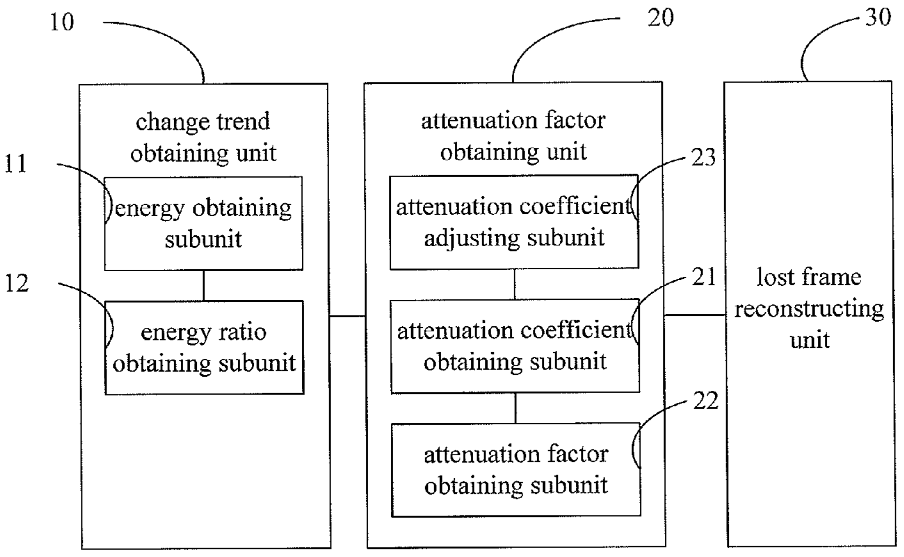
FIGS. 8A and 8B are schematic diagrams illustrating the structure of the apparatus for signal processing, according to Embodiment 3 of the present invention.
Figure 8B:
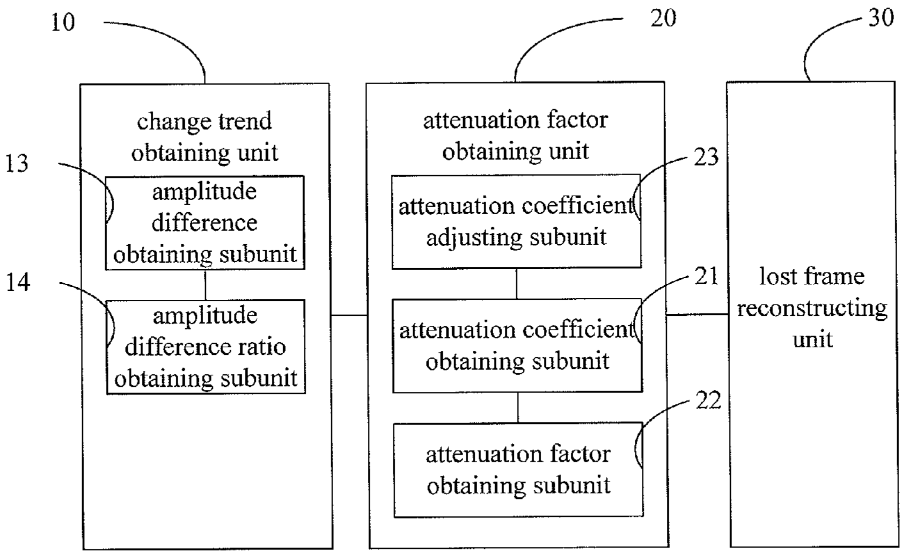

An apparatus for signal processing is provided in Embodiment 3 of the present invention, adapted to process the synthesized signal in packet loss concealment, as shown in FIG. 8A and FIG. 8B. Based on Embodiment 2, a lost frame reconstructing unit 30 correlative with the attenuation factor obtaining unit is added. The lost frame reconstructing unit 30 obtains a lost frame reconstructed after attenuating according to the attenuation factor obtained by the attenuation factor obtaining unit 20.

By using the apparatus provided by the above-mentioned embodiment, the self-adaptive attenuation factor is adjusted dynamically by using the change trend of the history signal, and a lost frame reconstructed after attenuating is obtained according to the attenuation factor, so that the smooth transition from the history data to the latest received data is realized. The attenuation speed is kept consistent as far as possible between the compensated signal and the original signal as much as possible for adapting the characteristic of various human voices.

Figure 9:
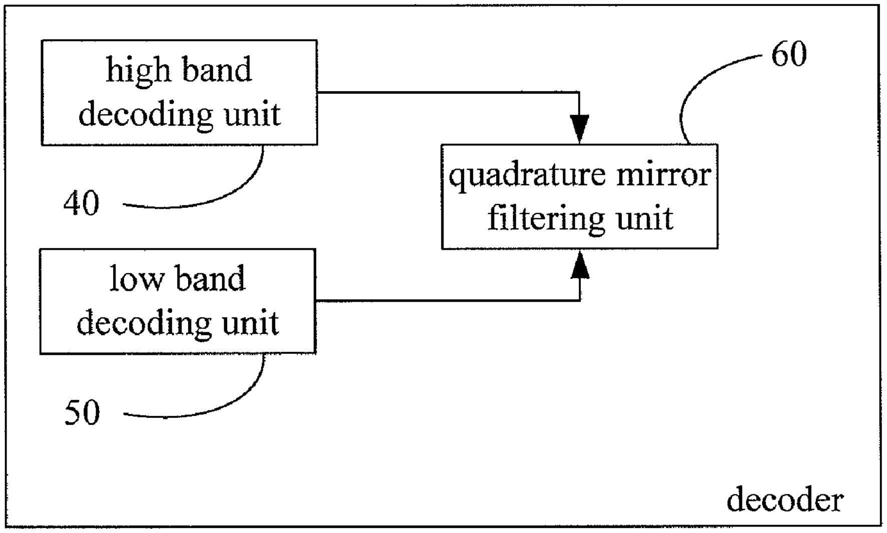
FIG. 9 is a schematic diagram illustrating the module of the voice decoder, according to Embodiment 4 of the present invention.

A voice decoder is provided by Embodiment 4 of the present invention, as shown in FIG. 9. The voice decoder includes: a high band decoding unit 40 is adapted to decode a high band decoding signal received and compensate a lost high band signal; a low band decoding unit 50 is adapted to decode a received low band decoding signal and compensate a lost low band signal; and a quadrature mirror filtering unit 60 is adapted to obtain a final output signal by synthesizing the low band decoding signal and the high band decoding signal. The high band decoding unit 40 decode the high band stream signal received by the receiving end, and synthesizes the lost high band signal. The low band decoding unit 50 decodes the low band stream signal received by the receiving end and synthesizes the lost low band signal. The quadrature mirror filtering unit 60 obtains the final decoding signal by synthesizing the low band decoding signal outputted by the low band decoding unit 50 and the high band decoding signal outputted by the high band decoding unit 40.

Figure 10:
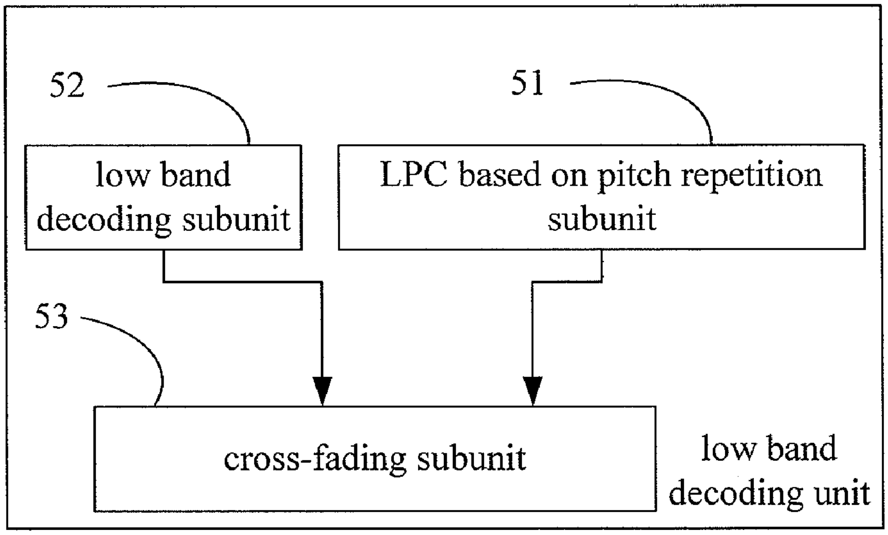
FIG. 10 is a schematic diagram illustrating the module of the low band decoding unit in the voice decoder, according to Embodiment 4 of the present invention.
Figure 11:
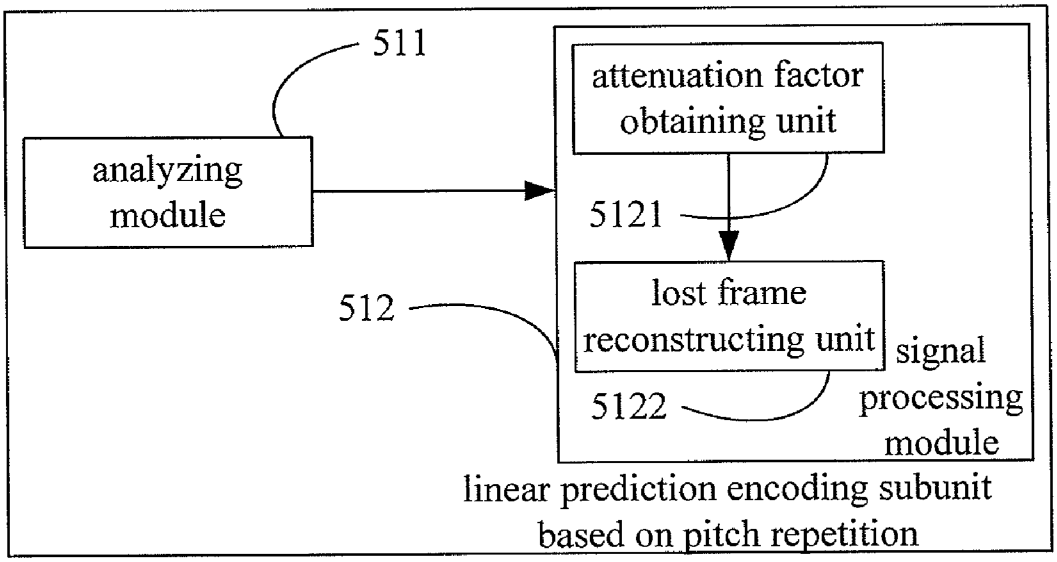
FIG. 11 is a schematic diagram illustrating the module of the LPC based on pitch repetition subunit, according to Embodiment 4 of the present invention.

For the low band decoding unit 50, as shown in FIG. 10, it includes the following units. A LPC based on pitch repetition subunit 51 which is adapted to generate a synthesized signal corresponding to the lost frame, a low band decoding subunit 52 which is adapted to decode a received low band stream signal, and a cross-fading subunit 53 which is adapted to cross fade for the signal decoded by the low band decoding subunit and the synthesized signal corresponding to the lost frame generated by the LPC based on pitch repetition subunit.

The low band decoding subunit 52 decodes the received low band stream signal. The LPC based on pitch repetition subunit 51 generates the synthesized signal by executing a LPC on the lost low band signal. And finally the cross-fading subunit 53 cross fades for the signal processed by the low band decoding subunit 52 and the synthesized signal in order to get a final decoding signal after the lost frame compensation.

The LPC based on pitch repetition subunit 51, as shown in FIG. 10, further includes an analyzing module 511 and a signal processing module 512. The analyzing module 511 analyzes a history signal, and generates a reconstructed lost frame signal; the signal processing module 512 obtains a change trend of a signal, and obtains an attenuation factor according to the change trend of the signal, and attenuates the reconstructed lost frame signal, and obtains a lost frame reconstructed after attenuating.

The signal processing module 512 further includes an attenuation factor obtaining unit 5121 and a lost frame reconstructing unit 5122. The attenuation factor obtaining unit 5121 obtains a change trend of a signal, and obtains an attenuation factor, according to the change trend; the lost frame reconstructing unit 5122 attenuates the reconstructed lost frame signal according to the attenuation factor, and obtains a lost frame reconstructed after attenuating. The signal processing module 512 includes two structures, corresponding to schematic diagrams illustrating the structure of the apparatus for signal processing in FIGS. 8A and 8B, respectively.

The attenuation factor obtaining unit 5121 includes two structures, corresponding to schematic diagrams illustrating the structure of the apparatus for obtaining an attenuation factor in FIGS. 6A and 6B, respectively. The specific functions and implementing means of the above modules and units may refer to the content revealed in the embodiments of method. Unnecessary details will not be repeated here.

Through the description of the above-mentioned embodiments, those skilled in the art may understand clearly that the present invention may be realized depending on software plus necessary and general hardware platform, and certainly may also be realized by hardware. However, in most situations, the former is a preferable embodiment. Based on such understanding, the essence or the part contributing to the prior art in the technical scheme of the present invention may be embodied through the form of software product which is stored in a storage media, and the software product includes some instructions for instructing one device to execute the embodiments of the present invention.

Though illustration and description of the present disclosure have been given with reference to embodiments thereof, it should be appreciated by persons of ordinary skill in the art that various changes in forms and details can be made without deviation from the scope of this disclosure.

What is claimed is:

1. A method for signal processing, for use in processing a synthesized signal in packet loss concealment, comprising:

obtaining a change trend of a signal, which comprises: obtaining a ratio of (1) a difference between a maximum amplitude value and a minimum amplitude value of a last pitch periodic signal to (2) a difference between a maximum amplitude value and a minimum amplitude value of a previous pitch periodic signal in the signal;

obtaining an attenuation factor according to the change trend of the signal; and obtaining a lost frame reconstructed after attenuating according to the attenuation factor;

wherein the ratio of the difference between the maximum amplitude value and the minimum amplitude value of the last pitch periodic signal to the difference between the maximum amplitude value and the minimum amplitude value of the previous pitch periodic signal in the signal is $R=P_1/P_2$; wherein, $P_1$ is the difference between the maximum amplitude value and the minimum amplitude value of the last pitch periodic signal, $P_2$ is the difference between the maximum amplitude value and the minimum amplitude value of the previous pitch periodic signal;

the lost frame reconstructed after attenuating obtained according to the change trend of the signal is:

$$yl(n)=yl_{pre}(n)*(1-C*(n+1))n=0, \ldots, N-1,$$

wherein $yl_{pre}$ is a reconstructed lost frame signal, the attenuation factor obtained according to the change trend of the signal is $1-C*(n+1)$ $n=0, \ldots, N-1$, C is the attenuation coefficient, $C=(1-R)T_0$; N is the length of the synthesized signal, $T_0$ is the length of a pitch period.

2. The method according to claim 1, wherein, before obtaining the attenuation factor according to the change trend of the signal, the method further comprises: obtaining the attenuation factor according to the change trend of the signal when the ratio is less than 1.

3. The method according to claim 1, wherein the attenuation factor $1-C*(n+1)=0$ is set when the attenuation factor $1-C*(n+1)<0$.

4. The method according to claim 1, wherein an upper limitation value is preset for the attenuation coefficient C, and the attenuation coefficient C is set to be the upper limitation when the C*(n+1) obtained according to $C=(1-R)/T_0$ exceeds a limitation value.

5. The method according to claim 1, wherein the attenuation coefficient C is decreased when the attenuation speed is too fast.

6. The method according to claim 5, wherein the attenuation coefficient C being decreased is:

presetting the signal to attenuate to 0 after M samples; and setting adjusted attenuation coefficient C=V/M, wherein V is a current attenuation factor.

7. An apparatus for signal processing, for use in processing a synthesized signal in packet loss concealment, comprising:

a change trend obtaining unit adapted to obtain a change trend of a signal;

an attenuation factor obtaining unit adapted to obtain an attenuation factor according to the change trend obtained by the change trend obtaining unit;

a lost frame reconstructing unit adapted to obtain a lost frame reconstructed after attenuating according to the attenuation factor;

wherein the change trend obtaining unit comprises:

an amplitude difference obtaining subunit adapted to obtain a difference between a maximum amplitude value and a minimum amplitude value of a last pitch periodic signal, and a difference between a maximum amplitude value and a minimum amplitude value of a previous pitch periodic signal in the signal; and an amplitude difference ratio obtaining subunit adapted to obtain a ratio of the difference of the last pitch periodic signal to the difference of the previous pitch periodic signal in the signal, wherein the difference of the last pitch periodic signal and the difference of the previous pitch periodic signal are obtained by the amplitude difference obtaining subunit, and the ratio is used to express the change trend of the signal;

wherein the ratio of the difference between the maximum amplitude value and the minimum amplitude value of the last pitch periodic signal to the difference between the maximum amplitude value and the minimum amplitude value of the previous pitch periodic signal in the signal is $R=P_1/P_2$; wherein, $P_1$ is the difference between the maximum amplitude value and the minimum amplitude value of the last pitch periodic signal, $P_2$ is the difference between the maximum amplitude value and the minimum amplitude value of the previous pitch periodic signal;

the lost frame reconstructed after attenuating obtained according to the change trend of the signal is:

$$yl(n)=yl_{pre}(n)*(1-C*(n+1))n=0, \ldots, N-1,$$

wherein $yl_{pre}$ is a reconstructed lost frame signal, the attenuation factor obtained according to the change trend of the signal is $1-C*(n+1)n=0, \ldots, N-1$, C is the attenuation coefficient, $C=(1-R)/T_0$, N is the length of the synthesized signal, $T_0$ is the length of a pitch period.

8. The apparatus according to the claim 7, wherein the attenuation factor obtaining unit comprises:

an attenuation coefficient obtaining subunit adapted to generate an attenuation coefficient according to the change trend obtained by the change trend obtaining unit; and an attenuation factor obtaining subunit adapted to obtain the attenuation factor according to the attenuation coefficient generated by the attenuation factor obtaining subunit.

9. The apparatus according to the claim 8, wherein the attenuation factor obtaining unit further comprises:

an attenuation coefficient adjusting subunit adapted to adjust the value of the attenuation coefficient obtained by the attenuation coefficient obtaining subunit to be a certain value when a given condition is satisfied;

wherein the given condition comprises at least one of the following conditions:

whether the value of the attenuation coefficient exceeds an upper limitation value;

whether there exists a situation of continuous frame loss; and whether an attenuation speed is too fast.

10. A non-transitory computer readable medium storing computer program code, wherein the computer program code makes a computer execute the following steps when the program code is executed by the computer:

obtaining a change trend of a signal, which comprises: obtaining a ratio of a difference between a maximum amplitude value and a minimum amplitude value of a last pitch periodic signal to a difference between a maximum amplitude value and a minimum amplitude value of a previous pitch periodic signal in the signal; and obtaining an attenuation factor according to the change trend of the signal; and obtaining a lost frame reconstructed after attenuating according to the attenuation factor;

wherein the ratio of the difference between the maximum amplitude value and the minimum amplitude value of the last pitch periodic signal to the difference between the maximum amplitude value and the minimum amplitude value of the previous pitch periodic signal in the signal is $R=/P_1/P_2$; wherein, $P_1$ is the difference between the maximum amplitude value and the minimum amplitude value of the last pitch periodic signal, $P_2$ is the difference between the maximum amplitude value and the minimum amplitude value of the previous pitch periodic signal;

the lost frame reconstructed after attenuating obtained according to the change trend of the signal is:

$$yl(n)=yl_{pre}(n)*(1-C*(n+1))n=0, \ldots, N-1,$$

wherein $yl_{pre}(n)$ is a reconstructed lost frame signal, the attenuation factor obtained according to the change trend of the signal is $1-C*(n+1)$ $n=0, \ldots, N-1$, C is the attenuation coefficient, $C=(1-R)T_0$, N is the length of the synthesized signal, $T_0$ is the length of a pitch period.

11. The non-transitory computer readable medium according to claim 10, wherein, before obtaining the attenuation factor according to the change trend of the signal, the method further comprises: obtaining the attenuation factor according to the change trend of the signal when the ratio is less than 1.

12. The non-transitory computer readable medium according to claim 10, wherein the attenuation factor $1-C*(n+1)=0$ is set when the attenuation factor $1-C*(n+1)<0$.

13. The non-transitory computer readable medium according to claim 10, wherein an upper limitation value is preset for the attenuation coefficient C, and the attenuation coefficient C is set to be the upper limitation when the C*(n+1) obtained according to $C=(1-R)/T_0$ exceeds a limitation value.

14. The non-transitory computer readable medium according to claim 10, wherein the attenuation coefficient C is decreased when the attenuation speed is too fast.

15. The non-transitory computer readable medium according to claim 14, wherein the attenuation coefficient C being decreased is:

presetting the signal to attenuate to 0 after M samples; and setting adjusted attenuation coefficient C=V/M, wherein V is a current attenuation factor.

* * * * *

UNITED STATES PATENT AND TRADEMARK OFFICE

CERTIFICATE OF CORRECTION

PATENT NO. : 8,320,265 B2
APPLICATION NO. : 12/264593
DATED : November 27, 2012
INVENTOR(S) : Zhan et al.

It is certified that error appears in the above-identified patent and that said Letters Patent is hereby corrected as shown below:

Column 13, line 50, "$Yl_{pre}$" should read -- $Yl_{pre}(n)$ --.

Signed and Sealed this
Nineteenth Day of February, 2013

Teresa Stanek Rea
*Acting Director of the United States Patent and Trademark Office*